(12) United States Patent
Chen et al.

(10) Patent No.: US 10,892,199 B2
(45) Date of Patent: Jan. 12, 2021

(54) SEMICONDUCTOR PACKAGE STRUCTURE, PRODUCT AND METHOD FOR MANUFACTURING THE SAME

(71) Applicant: Advanced Semiconductor Engineering, Inc., Kaohsiung (TW)

(72) Inventors: Yu-Ming Chen, Kaohsiung (TW); Yu-Sung Lin, Kaohsiung (TW); Tai-Hung Kuo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/372,107

(22) Filed: Apr. 1, 2019

(65) Prior Publication Data

US 2020/0312730 A1 Oct. 1, 2020

(51) Int. Cl.
*H01L 23/04* (2006.01)
*H01L 23/544* (2006.01)
*H01L 21/48* (2006.01)

(52) U.S. Cl.
CPC .......... *H01L 23/04* (2013.01); *H01L 21/4803* (2013.01); *H01L 23/544* (2013.01); *H01L 2223/54406* (2013.01)

(58) Field of Classification Search
CPC ... H01L 23/04; H01L 23/544; H01L 21/4803; H01L 2223/54406
See application file for complete search history.

(56) References Cited

U.S. PATENT DOCUMENTS

2019/0186960 A1\* 6/2019 Jo ....................... G01N 33/0009
2019/0204281 A1\* 7/2019 Choi .................... G01N 33/006

\* cited by examiner

*Primary Examiner* — Anthony Ho
(74) *Attorney, Agent, or Firm* — Foley & Lardner LLP (57) ABSTRACT

A semiconductor package structure includes a substrate, a semiconductor sensor, a lid and an air-permeable film. The semiconductor sensor is disposed on the substrate. The lid covers the semiconductor sensor and defines a through hole. The air-permeable film covers the through hole of the lid and has a first surface. The first surface is hydrophilic.

20 Claims, 11 Drawing Sheets

SEMICONDUCTOR PACKAGE STRUCTURE, PRODUCT AND METHOD FOR MANUFACTURING THE SAME

BACKGROUND

1. Field of the Disclosure

The present disclosure relates to a semiconductor package structure, a product and a manufacturing method, and to a semiconductor package structure including an air-permeable film having a mark, a product having an ink layer formed on an object, and a method for manufacturing the semiconductor package structure.

2. Description of the Related Art

An example semiconductor package structure may include a substrate, a microelectromechanical systems (MEMS) sensor disposed on a substrate, a lid covering the MEMS sensor and defining a through hole, and an air-permeable film covering the through hole of the lid. For recognition purpose of the semiconductor package structure, a mark is to be formed on the air-permeable film. Hence, it is desired to provide a technique for marking such air-permeable film.

SUMMARY

In some embodiments, a semiconductor package structure includes a substrate, a semiconductor sensor, a lid and an air-permeable film. The semiconductor sensor is disposed on the substrate. The lid covers the semiconductor sensor and defines a through hole. The air-permeable film covers the through hole of the lid and has a first surface. The first surface is hydrophilic.

In some embodiments, a product includes an object and an ink layer. The object has a surface and is made of a hydrophobic material. The ink layer is formed on the surface of the object and defines an opening to expose a portion of the surface of the object. The exposed portion of the surface of the object is in a shape of a symbol.

In some embodiments, a method for manufacturing a semiconductor package structure includes (a) providing a semiconductor package device including a substrate, a semiconductor sensor disposed on the substrate, a lid covering the semiconductor sensor and defining a through hole, and an air-permeable film covering the through hole of the lid, wherein the air-permeable film has a first surface; and (b) hydrophilic-modifying the first surface of the air-permeable film.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

An example semiconductor package structure may include a substrate, a microelectromechanical systems (MEMS) sensor, a lid and an expanded polytetrafluoroethene (ePTFE) film. The microelectromechanical systems (MEMS) sensor is disposed on the substrate. The lid covers the MEMS sensor and the substrate, and defines a through hole above the MEMS sensor. The ePTFE film covers the through hole of the lid. The ePTFE film is air-permeable and is hydrophobic, thus it is able to shield the MEMS sensor from dust and moisture. A thickness of the ePTFE film may be about 20 For recognition purpose of the semiconductor package structure, a mark is specified to be formed on the ePTFE film. The size of the semiconductor package structure is very small such as about 1 mm*1 mm, about 2 mm*2.5 mm, about 3 mm*3 mm or about 5 mm*5 mm. Thus, a marking area on the ePTFE film may be very small accordingly, such as about 0.4 mm*1.6 mm. Besides, at least four to six letters are specified to be formed within the marking area. Therefore, it is difficult to form a legible and recognizable mark (e.g., four to six letters) on the ePTFE film within the marking area.

In an example process, a laser source is utilized to remove portions of the ePTFE film, forming a mark on the ePTFE film. However, since the ePTFE film is white, and the thickness of the ePTFE film is merely 20 μm, the ePTFE film is light permeable. Thus, the laser beam may pass through the ePTFE film readily. In other words, light absorption of the ePTFE film is relatively low. Due to poor light absorption of the ePTFE film, the laser source may not efficiently leave a legible mark on the ePTFE film without damaging the ePTFE film.

In another example process, a heat curable ink is utilized for positive printing of a mark on the ePTFE film. However, since the ePTFE film is hydrophobic, shrinkage of the printed mark (e.g., cured ink) may occur during printing and heat curing. Hence, the mark may be still illegible. Besides, since the precision of printing is relatively low, the mark may not be precisely disposed within the marking area on the ePTFE film.

In still another example process, an UV curable ink is utilized for positive printing of a mark on the ePTFE film. The UV curable ink may be cured by a UV source immediately during printing, thus reducing shrinkage of the printed mark (e.g., cured ink). However, due to the hydrophobicity of the ePTFE film, resolution of the mark may be low. A minimum size of a letter formed by such process is about 1 mm*0.6 mm. A letter with a smaller size, such as about 0.8 mm*0.5 mm, may be illegible due to the poor resolution.

In still another example process, an ink layer, formed of the UV curable ink, is initially formed on the entire surface of the ePTFE film. Then, a laser source is utilized to remove portions of the ink layer, forming a mark (e.g., opening or through hole) on the ePTFE film. However, due to the hydrophobicity of the ePTFE film, bonding strength between the ink layer and the ePTFE film is relatively low. Hence, due to heat effect during laser marking, peelings of the ink layer may occur at edges thereof. Such peeling portions of the ink layer may also be removed by the laser source, thus making the mark illegible.

Hence, at least some embodiments of the present disclosure provide for a semiconductor package structure including an air-permeable film with a legible mark presented thereon. At least some embodiments of the present disclosure further provide for techniques for manufacturing the semiconductor package structure.

In addition, at least some embodiments of the present disclosure provide for a product with a legible mark presented thereon. At least some embodiments of the present disclosure further provide for techniques for manufacturing the product.

Figure 1:
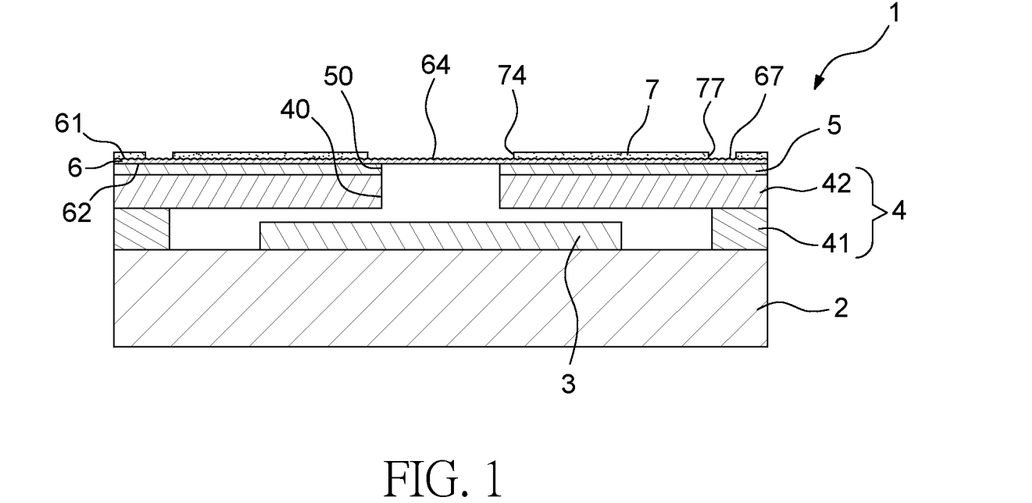
FIG. 1 illustrates a cross sectional view of an example of a semiconductor package structure according to some embodiments of the present disclosure.
Figure 2:
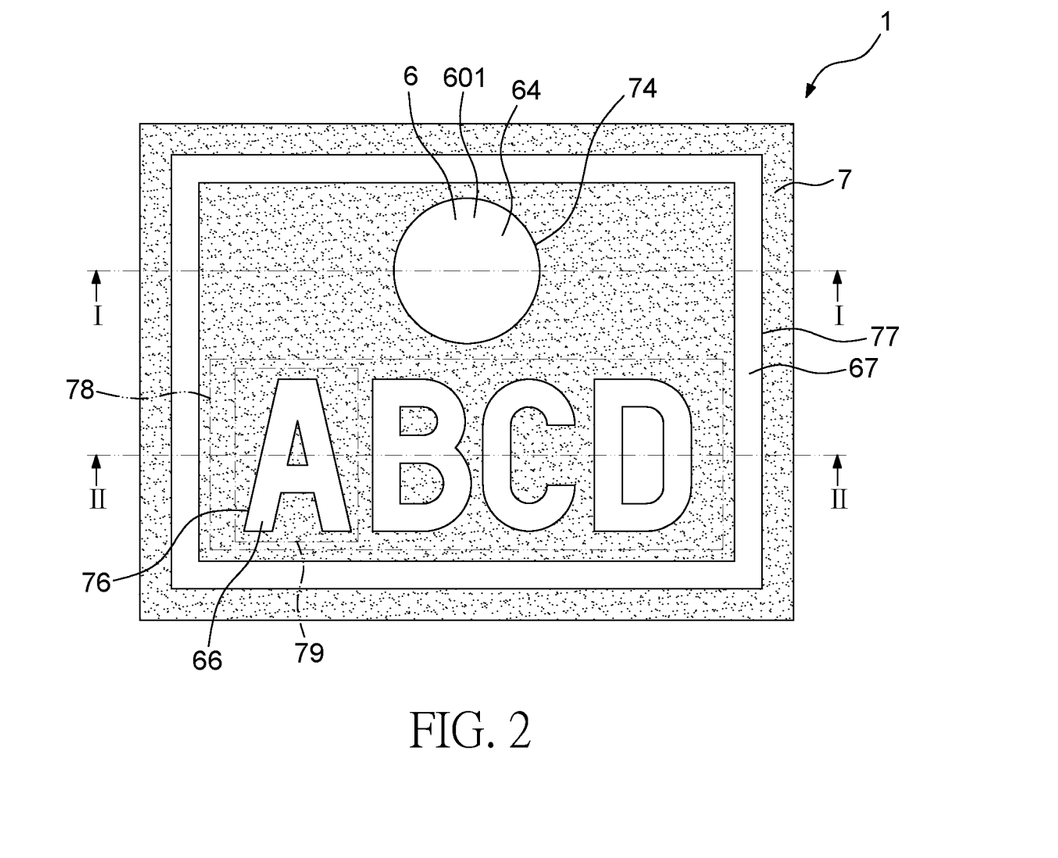
FIG. 2 illustrates a top view of the semiconductor package structure shown in FIG. 1.
Figure 3:
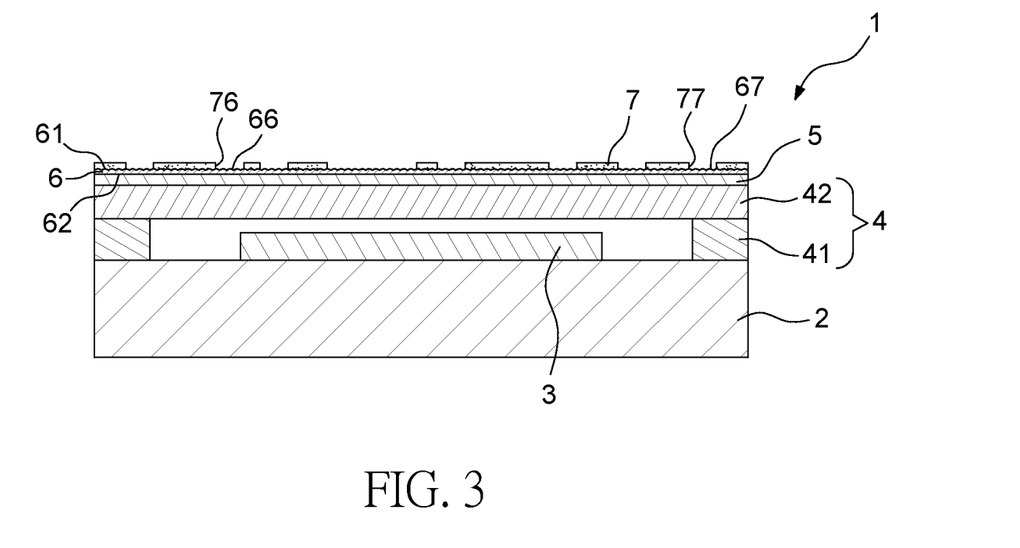
FIG. 3 illustrates a cross sectional view taken along line II-II in FIG. 2.
Figure 4:
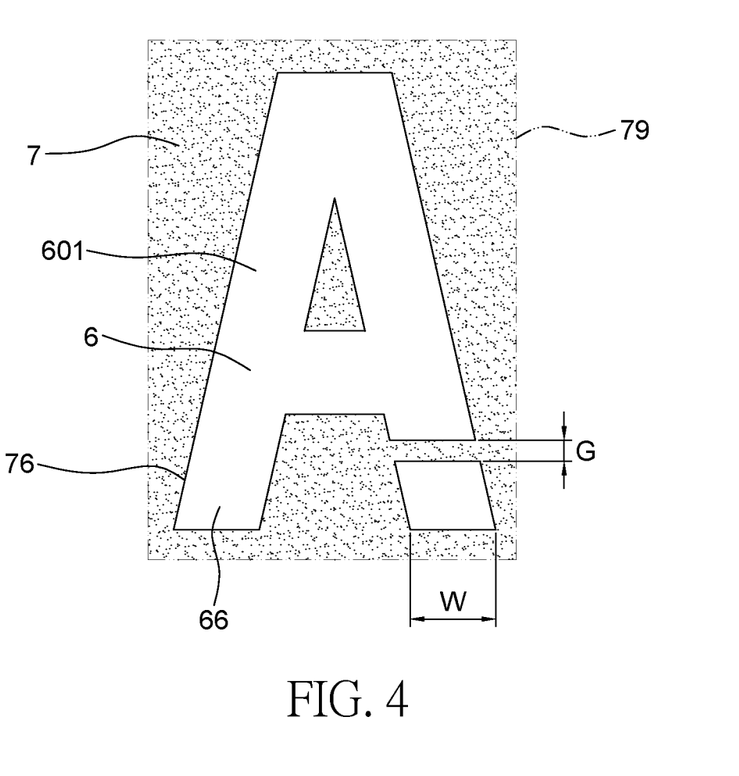
FIG. 4 illustrates a partially enlarged view of a region in FIG. 2.

FIG. 1 illustrates a cross sectional view of a semiconductor package structure 1 according to some embodiments of the present disclosure. FIG. 2 illustrates a top view of the semiconductor package structure 1 shown in FIG. 1, while FIG. 1 is a cross sectional view taken along line I-I in FIG. 2. FIG. 3 illustrates another cross sectional view of the semiconductor package structure 1 taken along line II-II in FIG. 2. FIG. 4 illustrates a partially enlarged view of a region in FIG. 2. The semiconductor package structure 1 may include a substrate 2, a semiconductor sensor 3, a lid 4, an adhesion layer 5, an air-permeable film 6 and an ink layer 7.

The substrate 2 may be a substrate of any type and material, which is not limited in the present disclosure. For example, the substrate 2 may include styrene-butadiene-styrene (SBS). In one embodiment, the substrate 2 may include a circuit layer disposed adjacent to a top surface thereof.

The semiconductor sensor 3 is disposed on and attached to the top surface of the substrate 2. In one embodiment, the semiconductor sensor 3 may be electrically connected to circuit layer of the substrate 2. The semiconductor sensor 3 may be a pressure sensor for sensing the air pressure. In some embodiments, the semiconductor sensor 3 may be a microelectromechanical systems (MEMS) sensor, such as a MEMS pressure sensor.

The lid 4 is disposed on the top surface of the substrate 2 and covers the semiconductor sensor 3. The lid 4 may include a ring portion 41 and a cover portion 42. The ring portion 41 is disposed on the substrate 2 and surrounds the semiconductor sensor 3. The cover portion 42 is disposed on the ring portion 41 and covers the semiconductor sensor 3. In some embodiments, the ring portion 41 and the cover portion 42 may be integrally formed as a monolithic structure. In some embodiments, the ring portion 41 and the cover portion 42 may be made of steel, such as stainless steel. In some embodiments, the ring portion 41 may be made of liquid crystal polymer (LCP). The lid 4 defines a through hole 40 corresponding to at least a portion of the semiconductor sensor 3, such as a sensing area of the semiconductor sensor 3. In one embodiment, the through hole 40 is located right above the sensing area of the semiconductor sensor 3, thus, the semiconductor sensor 3 may sense the air pressure readily. For example, the through hole 40 is defined by and extends through the cover portion 42 of the lid 40. In some embodiments, an area of the cover portion 42 from a top view may be about 2 mm*2.5 mm. A diameter of the through hole 40 from a top view may be about 100 μm to about 400 μm. In some embodiments, the lid 4 may define more than one through holes 40.

The adhesion layer 5 is disposed on the lid 4, such as disposed on the cover portion 42 of the lid 4. The adhesion layer 5 may also define a through hole 50 corresponding to the through hole 40 of the lid 4. The adhesion layer 5 may be cured from a silicon adhesive.

The air-permeable film 6 is disposed on the adhesion layer 5, and is adhered to the lid 4 through the adhesion layer 5. The air-permeable film 6 covers the through hole 40 of the lid 4. Thus, the air-permeable film 6 is able to shield the semiconductor sensor 3 from dust and moisture, and will not affect the air flow. The air-permeable film 6 has a first surface 61 and a second surface 62 opposite to the first surface 61. The second surface 62 faces the lid 4. The first surface 61 is hydrophilic. For example, the first surface 61 of the air-permeable film 6 has a water contact angle less than 90 degrees, such as less than 80 degrees, less than 70 degrees or less than 60 degrees. A thickness of the air-permeable film 6 may be about 20 μm.

In some embodiments, the air-permeable film 6 is made of a hydrophobic material, and the first surface 61 of the air-permeable film 6 is hydrophilic-modified (e.g., modified by a hydrophilic modification process). For example, the air-permeable film 6 may be made of a hydrophobic fluoropolymer, such as polytetrafluoroethene (PTFE), expanded PTFE (ePTFE), polychlorotrifluoroethylene (PCTFE), perfluoroalkoxy (PFA) or tetrafluorethylene-perfluoropropylene (FEP). The first surface 61 of the air-permeable film 6 has a hydrophilic functional group. For example, the hydrophilic functional group includes a C=O bond. A water contact angle of the hydrophobic fluoropolymer may be greater than 90 degrees, such as greater than 100 degrees, greater than 110 degrees or greater than 120 degrees. A hydrophilic modification (or hydrophilic surface treatment), such as plasma etching or sodium etching, may be performed on the first surface 61 of the air-permeable film 6 to make the first surface 61 hydrophilic. The second surface 62 of the air-permeable film 6 may remain hydrophobic after such hydrophilic modification on the first surface 61. For example, a water contact angle of the first surface 61 before the hydrophilic modification may be about 116 degrees, and may become about 65 degrees after the hydrophilic modification. However, in some embodiments, the second surface 62 may also be hydrophilic to enhance its bonding strength to the adhesion layer 5.

The ink layer 7 is disposed on and covers the air-permeable film 6. The ink layer 7 is formed on the first surface 61 of the air-permeable film 61, such as formed on the C=O bond. For example, the ink layer 7 contacts and is adhered to the first surface 61 of the air-permeable film 6. In some embodiments, the ink layer 7 is formed of a UV curable ink. For example, the UV curable ink may be "ECO-UV" produced by Roland DGA Corporation. Since the first surface 61 of the air-permeable film 6 is hydrophilic, the ink layer 7 may bond tightly to the first surface 61 of the air-permeable film 6. For recognition purpose, optical properties of the ink layer 7 may be different from optical properties of the air-permeable film 6. For example, a color of the ink layer 7 may be different from a color of the air-permeable film 6.

The ink layer 7 defines at least one opening to expose at least one portion of the first surface 61 of the air-permeable film 6. For example, the ink layer 7 defines a first opening 74 and a second opening 76. The first opening 74 extends through the ink layer 7, and exposes a first portion 64 of the first surface 61 of the air-permeable film 6 which corresponds to the through hole 40 of the lid 4. In one embodiment, the first opening 74 may be a circle corresponding to the through hole 40 of the lid 4. A diameter of the first opening 74 of the ink layer 7 may be greater than the diameter of the through hole 40 of the lid 4. For example, the diameter of the first opening 74 of the ink layer 7 may be about 500 μm.

The second opening 76 extends through the ink layer 7, and exposes a second portion 66 of the first surface 61 of the air-permeable film 6. The second opening 76 has a shape of a symbol, such as a sign, a letter or a character. Since the color of the ink layer 7 may be different from the color of the air-permeable film 6 (e.g., the ink layer 7 is black and the air-permeable film 6 is white), the exposed second portion 66 of the first surface 61 of the air-permeable film 6 is also exhibited in a shape of a symbol. The second portion 66 of the first surface 61 of the air-permeable film 6 exposed from the second opening 76 of the ink layer 7 may be recognized a mark on the air-permeable film 6. In some embodiments, as shown in FIG. 2, the shape of the opening 76 may be an English letter. In other embodiments, the shape of the opening 76 may be a geometric shape, a numeral, or a letter or character in other languages. In some embodiments, a size of the symbol may be equal to or smaller than about 0.4 mm*0.3 mm (e.g., for each of the letters shown in FIG. 2). However, in other embodiments, the size of the symbol may be about 0.175 mm*0.11 mm, about 0.255 mm*0.18 mm, about 0.275 mm*0.18 mm, about 0.325 mm*0.2 mm, about 0.4 mm*0.3 mm, about 0.8 mm*0.5 mm, or about 1.5 mm*1 mm. A line width "W" of the symbol, as shown in FIG. 4, may be about 20 μm to about 50 μm.

For example, the ink layer 7 has a marking area 78, and the second opening 76 is located within the marking area 78. A size of the marking area 78 may be about equal to or smaller than about 0.4 mm*1.6 mm, such as about 0.255 mm*1.02 mm, about 0.275 mm*1.02 mm or about 0.4 mm*1.6 mm. In some embodiments, the ink layer 7 may define a plurality of second openings 76 having shapes of symbols. In one embodiment, the ink layer 7 defines four to six, or even greater amount of the second openings 76 in the marking area 78. For example, the size of the marking area 78 may be about 0.275 mm*1.02 mm for four symbols with the size of about 0.275 mm*0.18 mm, and the size of the marking area 78 may be about 0.4 mm*1.6 mm for four symbols with the size of about 0.4 mm*0.3 mm. In some embodiments, the marking area 78 includes the entire area of the ink layer 7, but excludes the first opening 74.

As shown in FIG. 2 and FIG. 3, the ink layer 7 may further define a third opening 77 to extend through the ink layer 7 and expose a third portion 67 of the first surface 61 of the air-permeable film 6. The third opening 77 may surrounds the first opening 74 and the second opening 76. The third opening 77 may serve for locating purpose of the semiconductor package structure 1.

In some embodiments, the first opening 74, the second opening 76 and the third opening 77 may be formed by laser marking, e.g., removing portions of the ink layer 7 by using a laser source. Since the ink layer 7 bonds tightly to the first surface 61 of the air-permeable film 6, peelings of the ink layer 7 may not occur during laser marking. Hence, the symbol is provided with favorable resolution and is thus legible. For example, as shown in FIG. 4, the symbol "A" may include two segments spaced apart by a gap "G", and a width of the gap "G" is less than the line width "W" of one of the segments. In FIG. 4, the width of the gap "G" is less than the line width "W" of the segment, thus, the segment of the letter "A" is defined as a continuous line, and the letter "A" is determined to be legible or qualified. In a comparative embodiment, if the width of the gap "G" is greater than the line width "W" of the segment, the segment of the letter "A" is defined as a broken line, and the letter "A" is determined to be illegible or unqualified.

Figure 5:
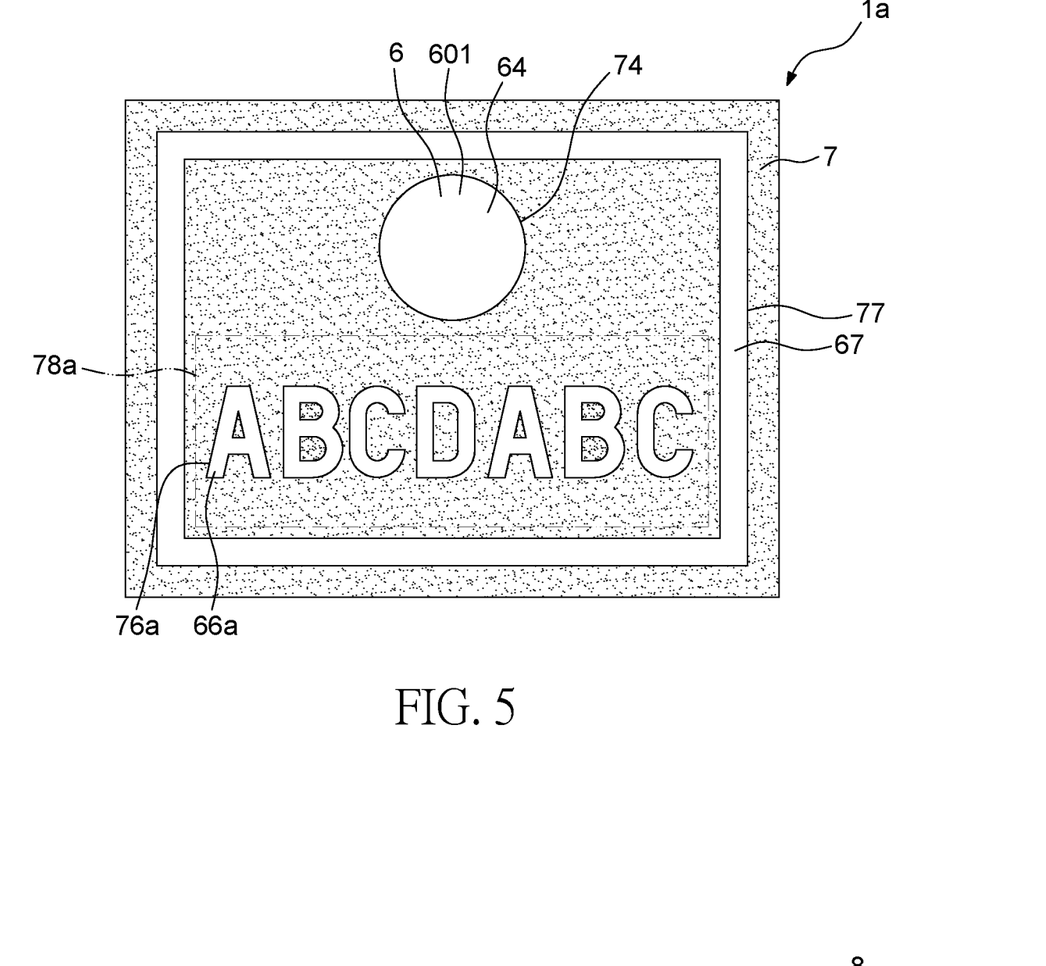
FIG. 5 illustrates a top view of an example of a semiconductor package structure according to some embodiments of the present disclosure.

FIG. 5 illustrates a top view of a semiconductor package structure 1a according to some embodiments of the present disclosure. The semiconductor package structure 1a is similar to the semiconductor package structure 1 shown in FIGS. 1 to 4, except that the size of the symbol (the shape of the second opening 76a or the second portion 66a) in the semiconductor package structure 1a is smaller than the size of the symbol (the shape of the second opening 76 or the second portion 66) in the semiconductor package structure 1. Hence, more than four symbols may be presented within the marking area 78a in the semiconductor package structure 1a.

Figure 6:
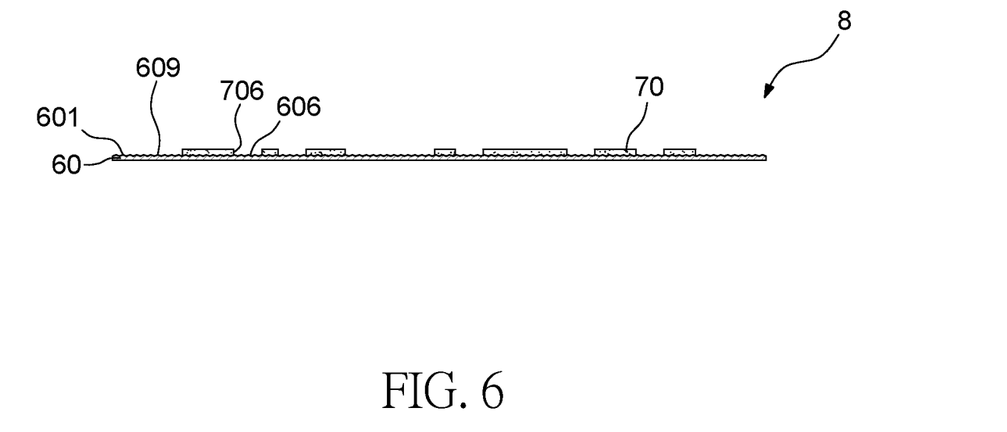
FIG. 6 illustrates a cross sectional view of an example of a product according to some embodiments of the present disclosure.
Figure 7:
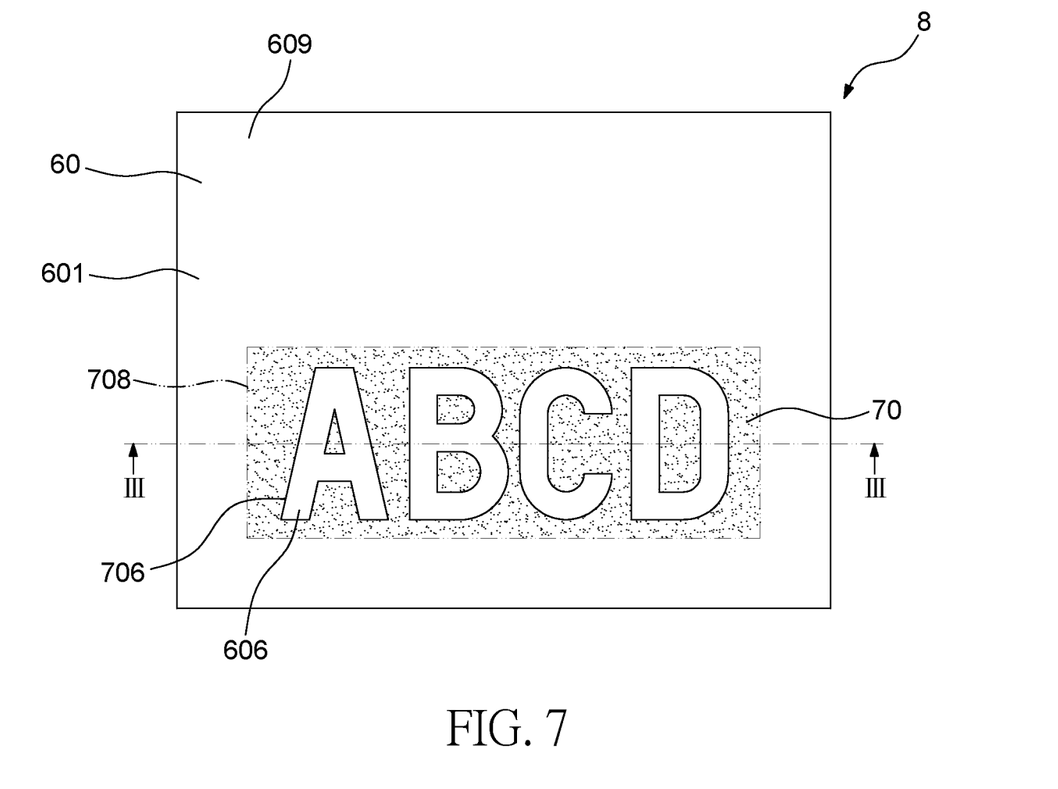
FIG. 7 illustrates a top view of the product shown in FIG. 6.

The present disclosure further provides a product, which has a legible mark presented thereon. FIG. 6 illustrates a cross sectional view of an example of a product 8 according to some embodiments of the present disclosure. FIG. 7 illustrates a top view of the product 8 shown in FIG. 6, while FIG. 6 is a cross sectional view taken along line in FIG. 7. The product 8 includes an object 60 and an ink layer 70.

The object 60 has a surface 601 and is made of a hydrophobic material. The object 60 may be an element of a semiconductor package structure, such as the air-permeable film 6 of the semiconductor package structure 1 described above. As shown in FIG. 6, the object 60 may be in a film shape. However, it is not to be taken as a limited sense. In some embodiments, the object 60 is made of a hydrophobic fluoropolymer, and the surface 601 of the object 60 is hydrophilic-modified (e.g., by plasma etching or sodium etching). For example, the surface 601 of the object 60 has a hydrophilic functional group. The hydrophilic functional group includes a C=O bond. A material of the object 60 may be similar to the material of the air-permeable 6 of the semiconductor package structure 1 as described above.

The ink layer 70 is adhered to the surface 601 of the object 60 and defines an opening 706 to expose a portion 606 of the surface 601 of the object 60. For example, the ink layer 70 is formed on the surface 601 of the object 60, such as formed on the C=O bond. The exposed portion 606 of the surface 601 of the object 60 is in a shape of a symbol, such as a sign, a letter or a character. In some embodiments, as shown in FIG. 7, the shape of the exposed portion 606 may be an English letter. In other embodiments, the shape of the exposed portion 606 may be a geometric shape, a numeral, or a letter or character in other languages. In some embodiments, a size of the symbol is equal to or smaller than about 0.4 mm*0.3 mm (e.g., for each of the letters shown in FIG. 7). A line width of the symbol is about 20 μm to about 50 μm. As shown in FIG. 7, the ink layer 70 and the opening 706 are located within a marking area 708, and are not extend to the entire surface 601 of the object 60. Hence, a portion 609 of the surface 601 of the object 60 not covered by the ink layer 70 may retain its original properties. In some embodiments, the portion 609 of the surface 601 of the object 60 may not be hydrophilic-modified, and may retain its original hydrophobicity.

Figure 8:
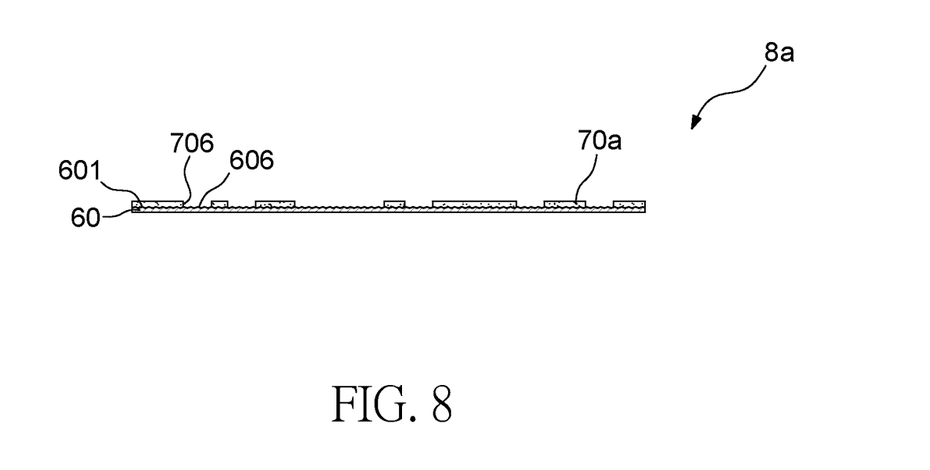
FIG. 8 illustrates a cross sectional view of an example of a product according to some embodiments of the present disclosure.
Figure 9:
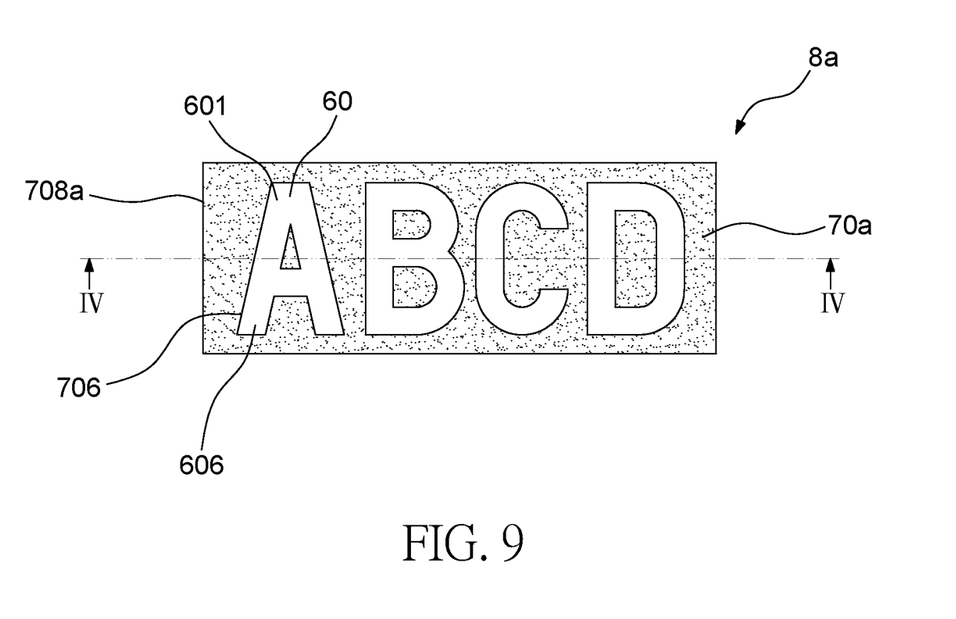
FIG. 9 illustrates a top view of the product shown in FIG. 8.

FIG. 8 illustrates a cross sectional view of an example of a product 8a according to some embodiments of the present disclosure. FIG. 9 illustrates a top view of the product 8a shown in FIG. 8, while FIG. 8 is a cross sectional view taken along line IV-IV in FIG. 9. The product 8a is similar to the product 8 shown in FIGS. 6 and 7, except that the ink layer 70a occupies the entire surface 601 of the object 60. That is, the marking area 708a covers the entire surface 601 of the object 60.

FIG. 10 through FIG. 17 illustrate a method for manufacturing a semiconductor package structure according to some embodiments of the present disclosure. In some embodiments, the method is for manufacturing the semiconductor package structure 1 shown in FIGS. 1 to 4.

Figure 10:
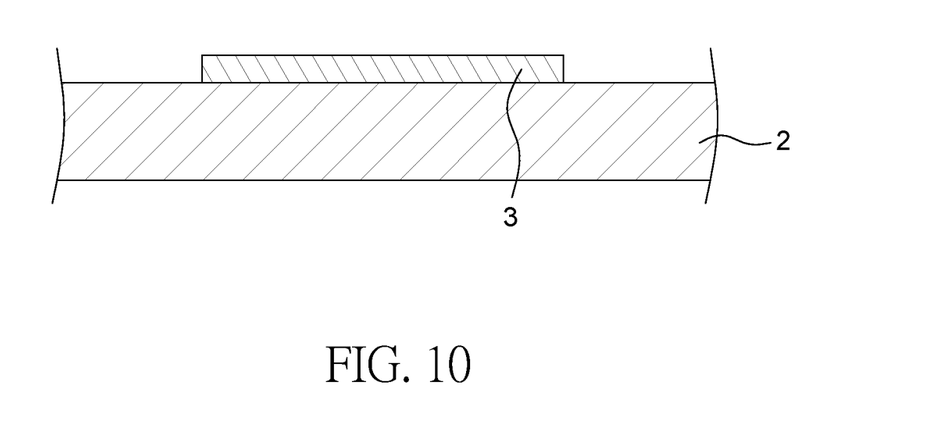
FIG. 10 illustrates one or more stages of an example of a method for manufacturing a semiconductor package structure according to some embodiments of the present disclosure.

Referring to FIG. 10, a substrate 2 is provided. The substrate 2 may be a substrate of any type and material, which is not limited in the present disclosure. In one embodiment, the substrate 2 may include a circuit layer disposed adjacent to a top surface thereof. Then, a semiconductor sensor 3 is disposed on and attached to the top surface of the substrate 2. The semiconductor sensor 3 may be a pressure sensor for sensing the air pressure. In some embodiments, the semiconductor sensor 3 may be a MEMS sensor, such as a MEMS pressure sensor.

Figure 11:
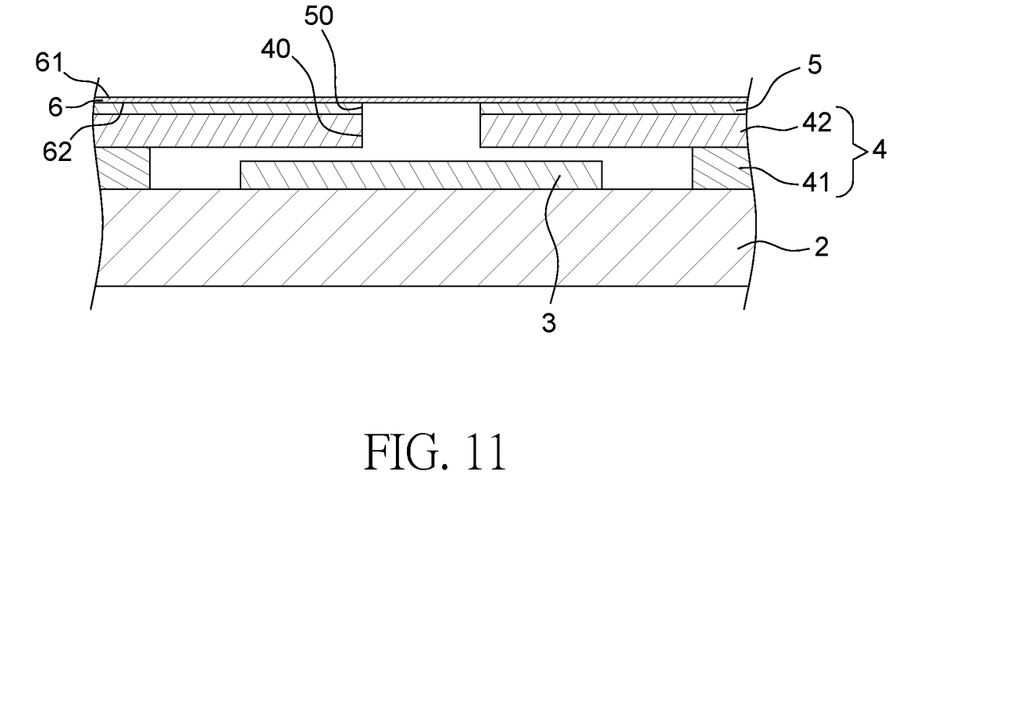
FIG. 11 illustrates one or more stages of an example of a method for manufacturing a semiconductor package structure according to some embodiments of the present disclosure.

Referring to FIG. 11, a lid 4 is disposed on the substrate 2 to cover the semiconductor sensor 3. The lid 4 may include a ring portion 41 and a cover portion 42. The ring portion 41 is disposed on the substrate 2 and surrounds the semiconductor sensor 3. The cover portion 42 is disposed on the ring portion 41 and covers the semiconductor sensor 3. In some embodiments, the ring portion 41 and the cover portion 42 may be integrally formed as a monolithic structure. The lid 4 defines a through hole 40 corresponding to at least a portion of the semiconductor sensor 3, such as a sensing area of the semiconductor sensor 3. In one embodiments, the through hole 40 is located right above the sensing area of the semiconductor sensor 3, thus, the semiconductor sensor 3 may sense the air pressure readily. For example, the through hole 40 is defined by and extends through the cover portion 42 of the lid 40. Then, an air-permeable film 6 is disposed to cover the lid 4 to cover the through hole 40 of the lid 4. The air-permeable film 6 may be adhered to the lid 4 through an adhesion layer 5. For example, the adhesion layer 5 is disposed on the lid 4, such as disposed on the cover portion 42 of the lid 4. The adhesion layer 5 may be cured from a silicon adhesive. The adhesion layer 5 may also define a through hole 50 corresponding to the through hole 40 of the lid 4. The air-permeable film 6 is disposed on the adhesion layer 5 and covers the through hole 40 of the lid 4. The air-permeable film 6 has a first surface 61 and a second surface 62 opposite to the first surface 61. The second surface 62 faces the lid 4. The air-permeable film 6 may be made of a hydrophobic material. That is, the first surface 61 and the second surface 62 of the air-permeable film 6 are both hydrophobic at the stage shown in FIG. 11. For example, the first surface 61 may have a water contact angle greater than 90 degrees.

Figure 12:
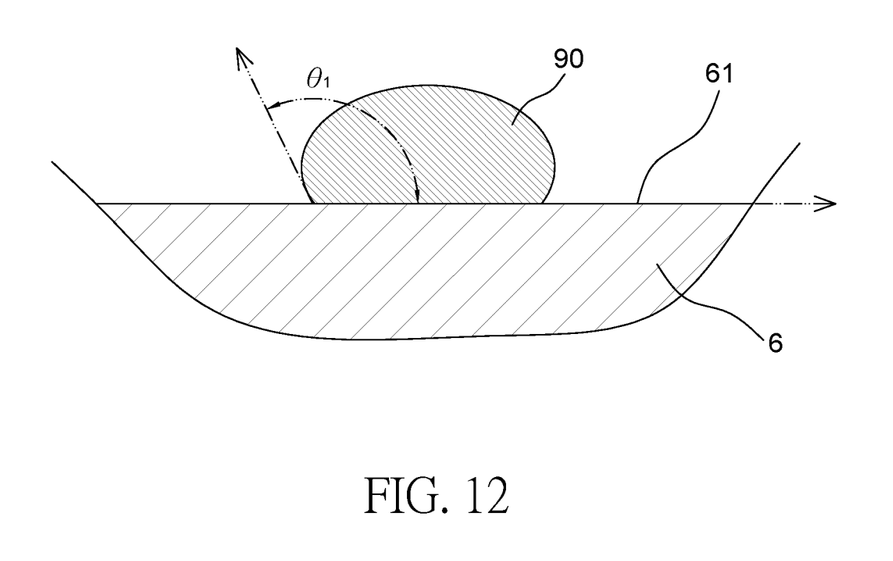
FIG. 12 illustrates a schematic view of measurement of water contact angle on a first surface of an air-permeable film shown in FIG. 11.

FIG. 12 illustrates a schematic view of measurement of water contact angle on the first surface 61 of the air-permeable film 6 shown in FIG. 11. Referring to FIG. 12, a water drop 90 is disposed on the first surface 61 of the air-permeable film 6 at the stage shown in FIG. 11. In some embodiments, a contact angle $\theta_1$ of the water drop 90 to the first surface 61 of the air-permeable film 6 may be about 116 degrees.

Figure 13:
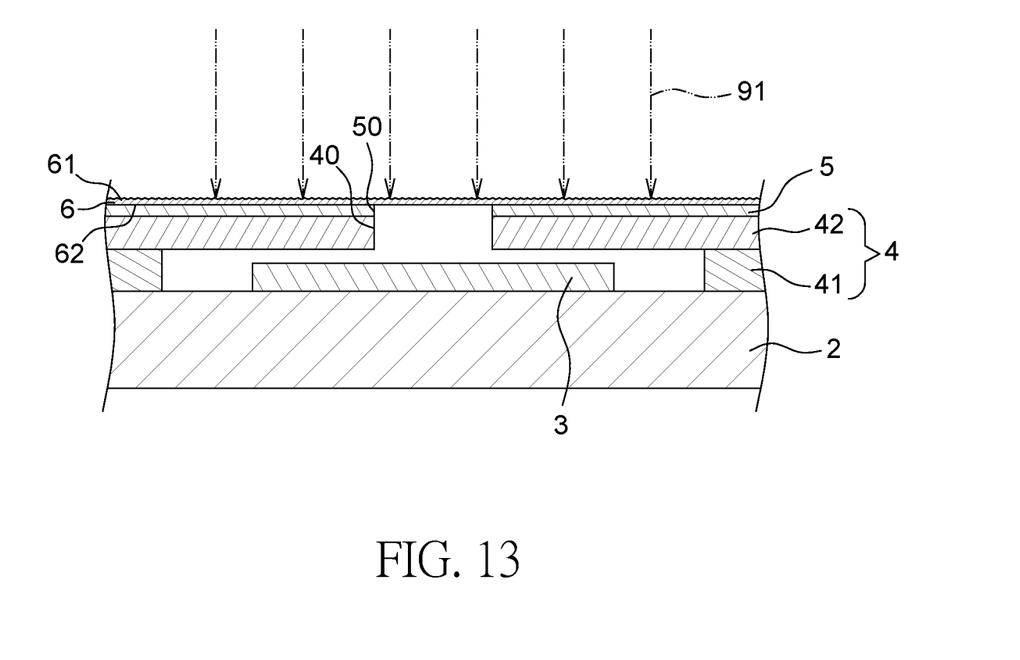
FIG. 13 illustrates one or more stages of an example of a method for manufacturing a semiconductor package structure according to some embodiments of the present disclosure.

Referring to FIG. 13, the first surface 61 of the air-permeable film 6 is then modified. The first surface 61 of the air-permeable film 6 may be modified by a hydrophilic modification process, such as plasma etching or sodium etching. For example, the first surface 61 of the air-permeable film 6 is modified by breaking a C—C bond and/or a C—F bond thereof. The C—C bond and/or the C—F bond may be broken by plasma etching or sodium etching. For Example, as shown in FIG. 13, the first surface 61 of the air-permeable film 6 is modified by a plasma 91.

Figure 14A:
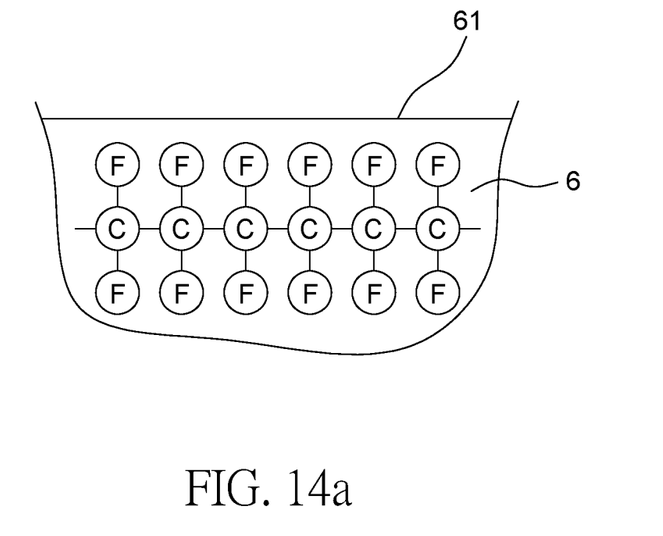
FIG. 14a illustrates a proposed chemical structure of the first surface of the air-permeable film shown in FIG. 11 before hydrophilic modification.
Figure 14B:
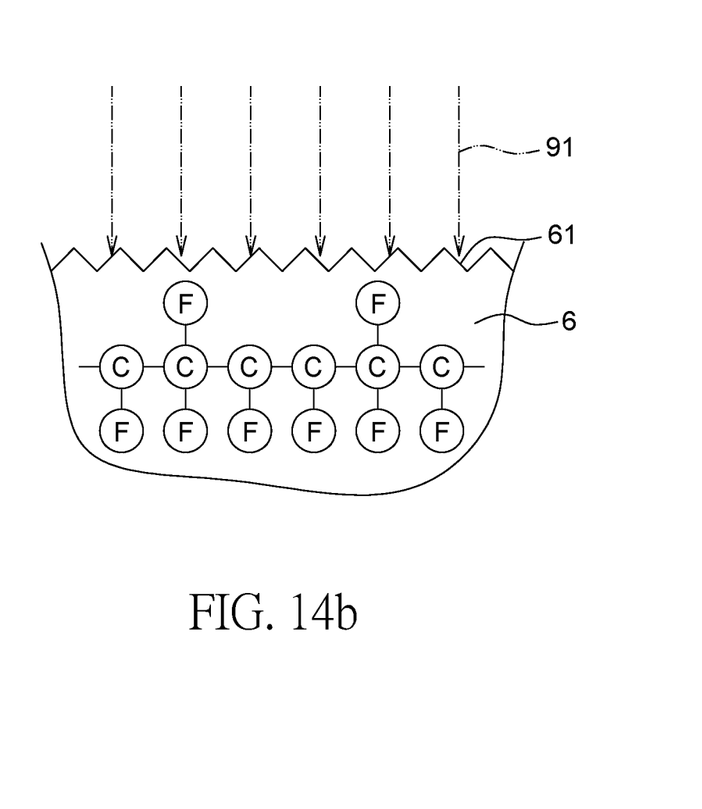
FIG. 14b illustrates a proposed chemical structure of the first surface of the air-permeable film shown in FIG. 11 during hydrophilic modification.
Figure 14C:
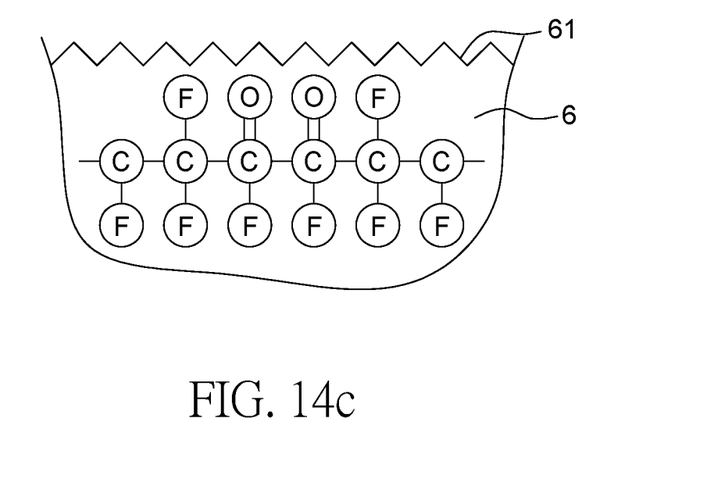
FIG. 14c illustrates a proposed chemical structure of the first surface of the air-permeable film shown in FIG. 11 after hydrophilic modification.

FIGS. 14a, 14b and 14c respectively illustrate proposed chemical structures of the first surface 61 of the air-permeable film 6 before, during and after the hydrophilic modification process. While not willing to be bound by any theory, it is believed that the mechanism of the hydrophilic modification process may be briefly described as follows.

Referring to FIG. 14a, the first surface 61 is smooth and includes a C—F bond and/or a C—C bond. Accordingly, the first surface 61 is hydrophobic. Referring to FIG. 14b, during plasma etching, the C—F bond and/or the C—C bond are broken by the plasma 91 and the first surface 61 becomes rough. Then, referring to FIG. 14c, the broken C— bonds may react with oxygen in the air to form C=O bonds. Accordingly, the surface 61 becomes hydrophilic. For example, the first surface 61 may have a water contact angle less than 90 degrees.

Figure 15:
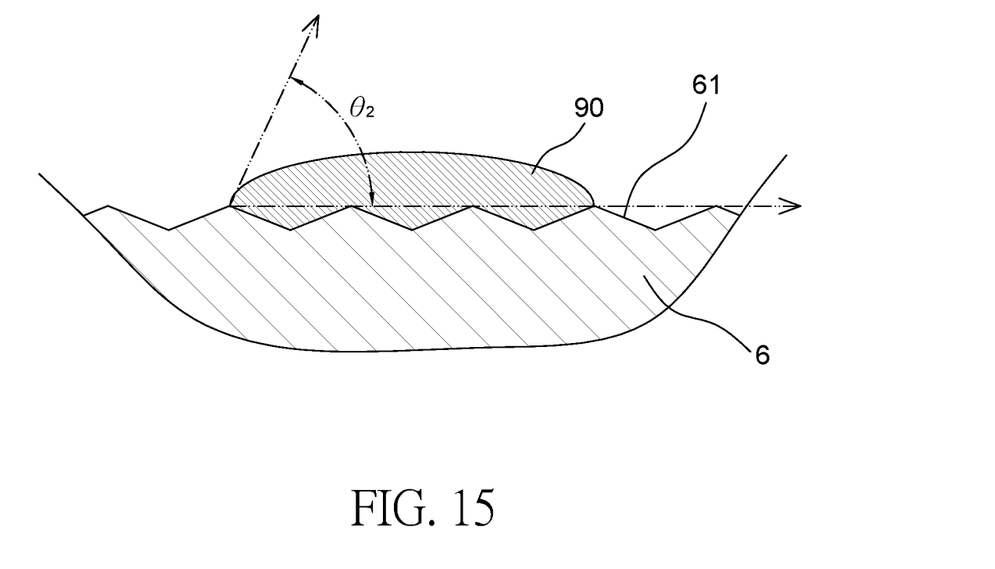
FIG. 15 illustrates a schematic view of measurement of water contact angle on a first surface of an air-permeable film shown in FIG. 13.

FIG. 15 illustrates a schematic view of measurement of water contact angle on the first surface 61 of the air-permeable film 6 shown in FIG. 13. Referring to FIG. 15, a water drop 90 is disposed on the first surface 61 of the air-permeable film 6 after the stage shown in FIG. 13. In some embodiments, a contact angle $\theta_2$ of the water drop 90 to the first surface 61 of the air-permeable film 6 may be about 65 degrees.

Figure 16:
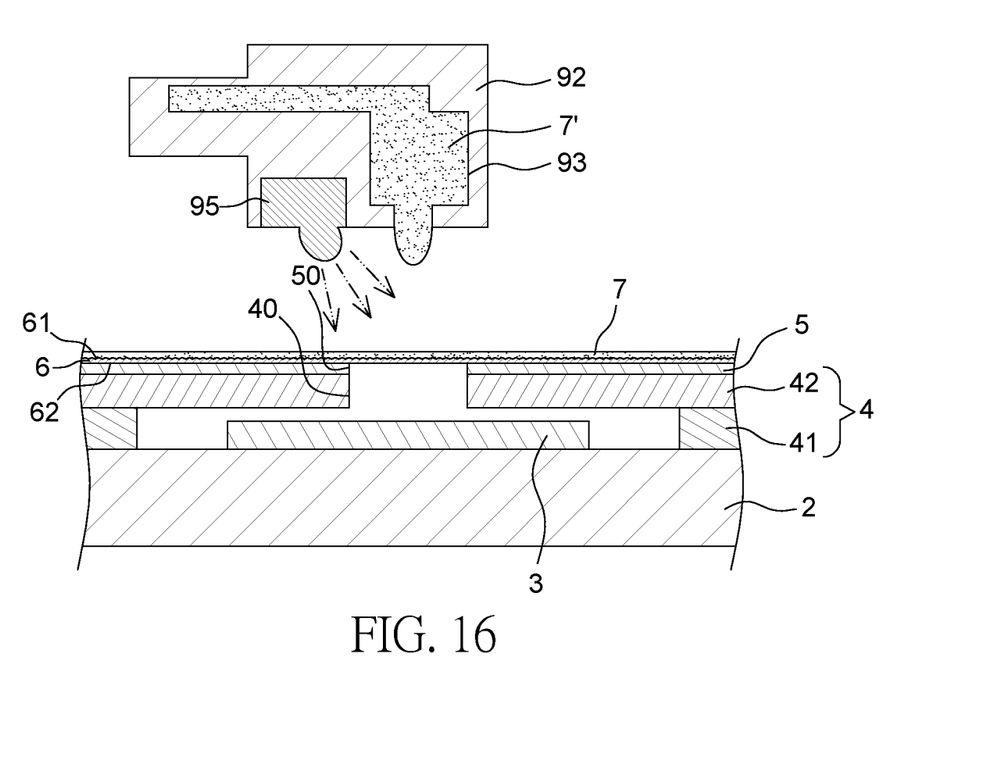
FIG. 16 illustrates one or more stages of an example of a method for manufacturing a semiconductor package structure according to some embodiments of the present disclosure.

Referring to FIG. 16, the first surface 61 of the air-permeable film 6 is coated with an ink layer 7. That is, the ink layer 7 is formed on the first surface 61 of the air-permeable film 6, such as formed on the C=O bond. For example, a printing structure 92 is utilized for applying an ink material 7'. The ink material 7' is sprayed by a nozzle 93 of the printing structure 92 on the first surface 61 of the air-permeable film 6. After spraying, the ink material 7' is immediately cured by a UV source 95 of the printing structure 92 adjacent to the nozzle 93, thus forming the ink layer 7. The ink layer 7 may cover the entire first surface 61 of the air-permeable film 6. Since the first surface 61 of the air-permeable film 6 is hydrophilic, the ink layer 7 may bond tightly to the first surface 61 of the air-permeable film 6. Besides, since the ink layer 7 is cured immediately after spraying, risk of shrinkage of the ink layer 7 may be reduced. For recognition purpose, optical properties of the ink layer 7 may be different from optical properties of the air-permeable film 6. For example, a color of the ink layer 7 may be different from a color of the air-permeable film 6.

Figure 17:
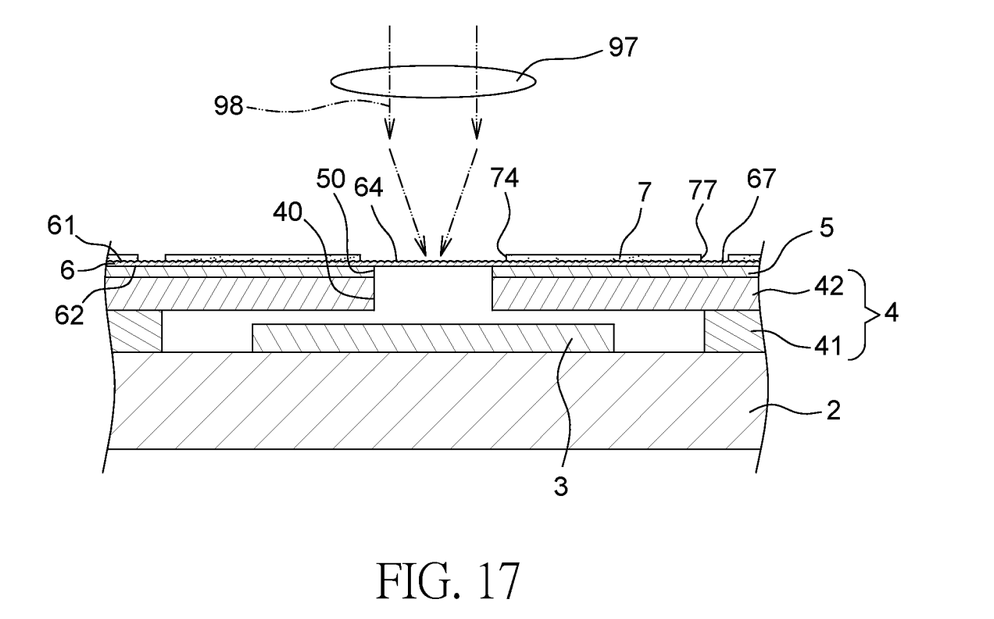
FIG. 17 illustrates one or more stages of an example of a method for manufacturing a semiconductor package structure according to some embodiments of the present disclosure.

Referring to FIG. 17, at least one portion of the ink layer 7 is removed by, for example, using a laser source 98, to expose at least one portion of the first surface 61 of the air-permeable film 6. As shown in FIG. 17, the laser source 98 is focused by a focusing lens 97. For example, portions of the ink layer 7 are removed by the laser source 98, thus forming a first opening 74, a second opening 76 and a third opening 77 as shown in FIG. 2.

The first opening 74 extends through the ink layer 7, and exposes a first portion 64 of the first surface 61 of the air-permeable film 6 which corresponds to the through hole 40 of the lid 4. In one embodiment, the first opening 74 may be a circle corresponding to the through hole 40 of the lid 4. A diameter of the first opening 74 of the ink layer 7 may be greater than the diameter of the through hole 40 of the lid 4.

The second opening 76 extends through the ink layer 7, and exposes a second portion 66 of the first surface 61 of the air-permeable film 6. The second opening 76 has a shape of a symbol, such as a sign or a character. Since the color of the ink layer 7 may be different from the color of the air-permeable film 6 (e.g., the ink layer 7 is black and the air-permeable film 6 is white), the second portion 66 of the first surface 61 of the air-permeable film 6 is also exhibited in a shape of a symbol. The second portion 66 of the first surface 61 of the air-permeable film 6 exposed from the second opening 76 of the ink layer 7 may be recognized a mark on the air-permeable film 6. The third opening 77 extends through the ink layer 7, and expose a third portion 67 of the first surface 61 of the air-permeable film 6. The third opening 77 may surrounds the first opening 74 and the second opening 76. The third opening 77 may serve for locating purpose of the semiconductor package structure 1.

Since the ink layer 7 bonds tightly to the first surface 61 of the air-permeable film 6, peelings of the ink layer 7 may not occur when forming the second opening 76 using the laser source 98. Hence, the symbol is provided with favorable resolution and is thus legible.

Then, a singulation process may be conducted to the substrate 2, the lid 4, the adhesion layer 5, the air-permeable film 6 and the ink layer 7, thus forming the semiconductor package structure 1 as shown in FIGS. 1 to 4. In some embodiments, the singulation process may be conducted after the stage shown FIG. 11, and the stages shown in FIGS. 13 to 17 may be conducted to single units formed after the singulation process. In some embodiments, the hydrophilic modification process may be conducted to the first surface 61 of the air-permeable film 6 before disposing the air-permeable film 6 on the adhesion layer 5. Besides, the second surface 62 may also be hydrophilic.

Figure 18:
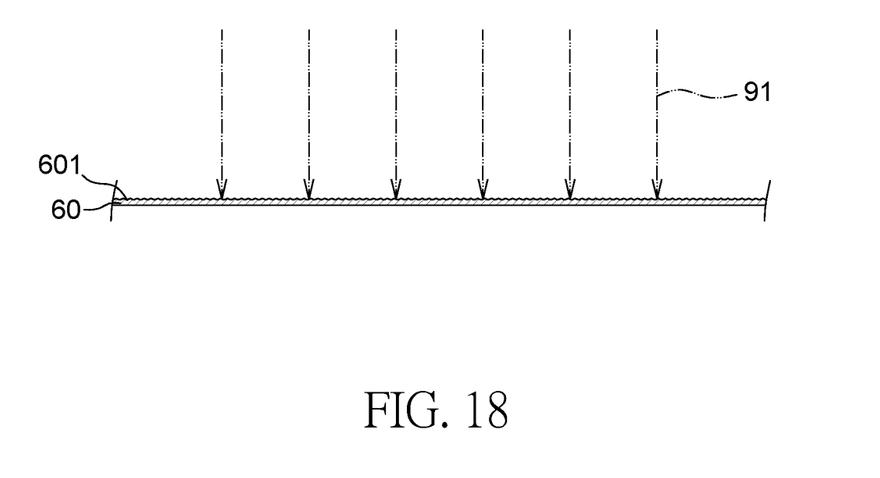
FIG. 18 illustrates one or more stages of an example of a method for manufacturing a product according to some embodiments of the present disclosure.
Figure 19:
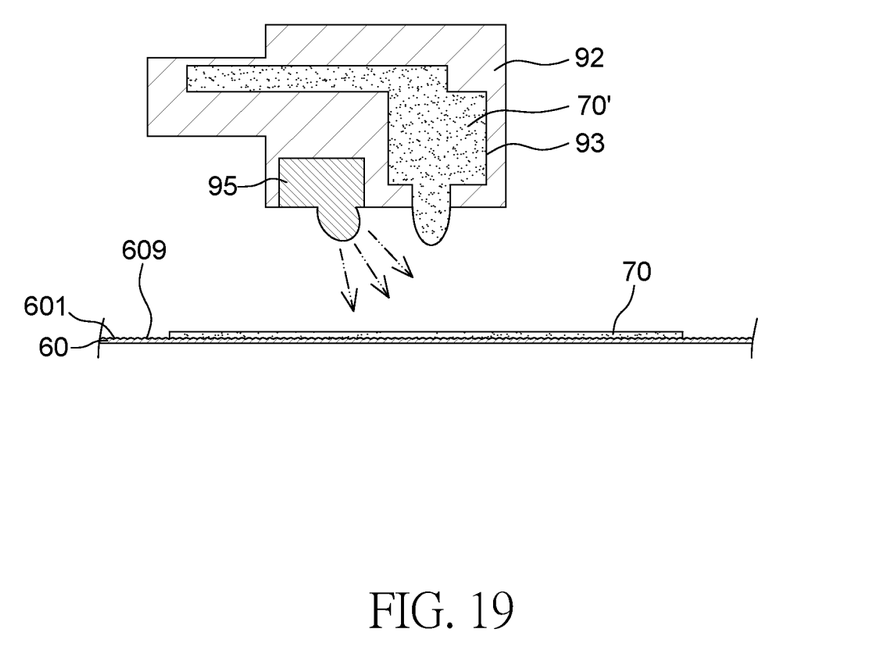
FIG. 19 illustrates one or more stages of an example of a method for manufacturing a product according to some embodiments of the present disclosure.
Figure 20:
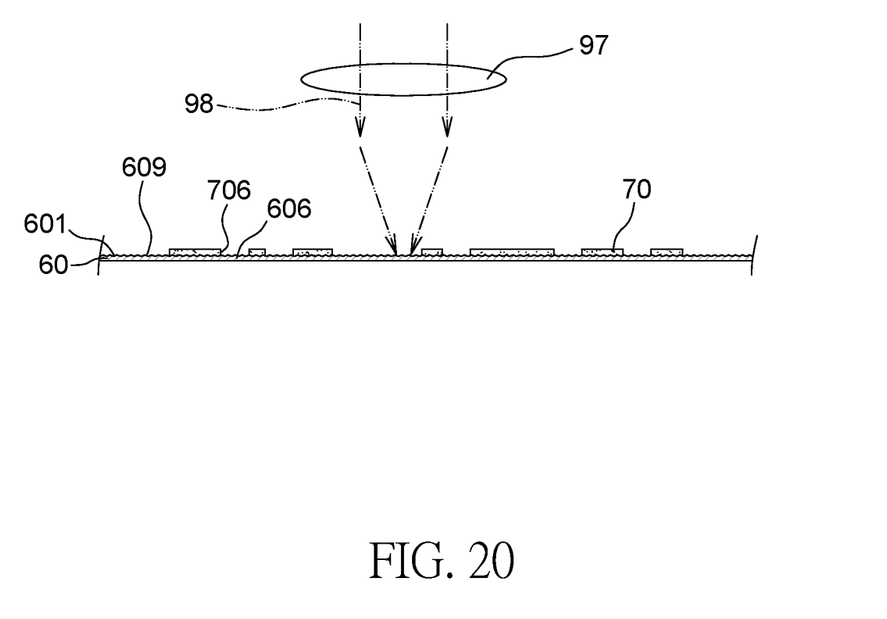
FIG. 20 illustrates one or more stages of an example of a method for manufacturing a product according to some embodiments of the present disclosure.

FIG. 18 through FIG. 20 illustrate a method for manufacturing a product according to some embodiments of the present disclosure. In some embodiments, the method is for manufacturing the product 8 shown in FIGS. 6 and 7.

Referring to FIG. 18, an object 60 is provided. The object 60 has a surface 601 and is made of a hydrophobic material. Accordingly, the surface 601 of the object 60 may initially be hydrophobic. The object 60 may be an element of a semiconductor package structure, such as the air-permeable film 6 of the semiconductor package structure 1 described above. As shown in FIG. 18, the object 60 may be in a film shape. However, it is not to be taken as a limited sense. In some embodiments, the object 60 is made of a hydrophobic fluoropolymer.

Then, the surface 601 of the object 60 is hydrophilic-modified. For example, the surface 601 of the object 60 may be modified by a hydrophilic modification process, such as plasma etching or sodium etching. As shown in FIG. 18, the surface 601 of the object 60 is modified by a plasma 91, thus becomes hydrophilic. The hydrophilic modification process may be conducted to the entire surface 601 of the object 60. Alternatively, the hydrophilic modification process may be selectively conducted to a portion of the surface 601 of the object 60 which may be covered by an ink layer 70, as shown in FIG. 19.

Referring to FIG. 19, the surface 601 of the object 60 is coated with an ink layer 70. For example, a printing structure 92 is utilized for applying an ink material 70'. The ink material 70' is sprayed by a nozzle 93 of the printing structure 92 on the surface 601 of the object 60. After spraying, the ink material 70' is immediately cured by a UV source 95 of the printing structure 92 adjacent to the nozzle 93, thus forming an ink layer 70 covering the surface 601 of the object 60. The ink layer 70 may cover a portion of the surface 601 of the object 60 and may be located within a marking area 708. Since the surface 601 of the object 60 is hydrophilic, the ink layer 7 may bond tightly to the surface 601 of the object 60. Besides, since the ink layer 7 is cured immediately after spraying, risk of shrinkage of the ink layer 7 may be reduced. A portion 609 of the surface 601 of the object 60 outside the marking area 708 may not be covered by the ink layer 70.

Referring to FIG. 20, a portion of the ink layer 7 is removed by, for example, using a laser source 98, to expose a portion 606 of the surface 601 of the object 60. As shown in FIG. 20, the laser source 98 is focused by a focusing lens 97. For example, a portion of the ink layer 7 is removed by the laser source 98, thus forming an opening 706 as shown in FIG. 7. Since the ink layer 7 bonds tightly to the surface 601 of the object 60, peelings of the ink layer 7 may not occur when forming the opening 706 using the laser source 98. Hence, the symbol is provided with favorable resolution and is thus legible.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a substrate;
   a semiconductor sensor disposed on the substrate;
   a lid covering the semiconductor sensor and defining a through hole; and
   an air-permeable film covering the through hole of the lid and having a first surface, wherein the first surface is hydrophilic.

2. The semiconductor package structure of claim 1, wherein the air-permeable film is made of a hydrophobic material, and the first surface of the air-permeable film is hydrophilic-modified.

3. The semiconductor package structure of claim 2, wherein the air-permeable film is made of polytetrafluoroethene (PTFE), expanded PTFE (ePTFE), polychlorotrifluoroethylene (PCTFE), perfluoroalkoxy (PFA) or tetrafluorethylene-perfluoropropylene (FEP).

4. The semiconductor package structure of claim 1, further comprising an ink layer covering the air-permeable film.

5. The semiconductor package structure of claim 4, wherein the ink layer is formed on the first surface of the air-permeable film.

6. The semiconductor package structure of claim 4, wherein the ink layer defines at least one opening to expose at least one portion of the first surface of the air-permeable film.

7. The semiconductor package structure of claim 6, wherein the at least one opening of the ink layer includes a first opening corresponding to the through hole of the lid.

8. The semiconductor package structure of claim 6, wherein the at least one opening of the ink layer includes a second opening having a shape of a symbol.

9. The semiconductor package structure of claim 8, wherein a size of the symbol is equal to or smaller than about 0.4 mm*0.3 mm.

10. The semiconductor package structure of claim 8, wherein the symbol includes two segments spaced apart by a gap, and a width of the gap is less than a line width of one of the segments.

11. The semiconductor package structure of claim 4, wherein the ink layer has a marking area, and a size of the marking area is equal to or smaller than about 0.4 mm*1.6 mm.

12. The semiconductor package structure of claim 4, wherein the first surface of the air-permeable film has a hydrophilic functional group.

13. The semiconductor package structure of claim 12, wherein the hydrophilic functional group includes a C=O bond.

14. The semiconductor package structure of claim 13, wherein the ink layer is formed on the C=O bond.

15. The semiconductor package structure of claim 4, wherein the ink layer is formed of a UV curable ink.

16. A product, comprising:
an object having a surface and made of a hydrophobic material; and
an ink layer formed on the surface of the object and defining an opening to expose a portion of the surface of the object, wherein the exposed portion of the surface of the object is in a shape of a symbol.

17. The product of claim 16, wherein the object is made of a hydrophobic fluoropolymer, and the surface of the object is hydrophilic-modified.

18. The product of claim 16, wherein the surface of the object has a hydrophilic functional group.

19. The product of claim 18, wherein the hydrophilic functional group includes a C=O bond.

20. The product of claim 19, wherein the ink layer is formed on the C=O bond.

* * * * *